United States Patent
Lv et al.

(10) Patent No.: US 12,507,477 B2
(45) Date of Patent: Dec. 23, 2025

(54) ARRAY SUBSTRATE AND DISPLAY PANEL

(71) Applicant: TCL CHINA STAR OPTOELECTRONICS TECHNOLOGY CO., LTD., Shenzhen (CN)

(72) Inventors: Xiaowen Lv, Shenzhen (CN); Li Zhao, Shenzhen (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 1126 days.

(21) Appl. No.: 17/598,196

(22) PCT Filed: Aug. 19, 2021

(86) PCT No.: PCT/CN2021/113503
§ 371 (c)(1),
(2) Date: Sep. 24, 2021

(87) PCT Pub. No.: WO2023/015592
PCT Pub. Date: Feb. 16, 2023

(65) Prior Publication Data
US 2024/0021624 A1   Jan. 18, 2024

(30) Foreign Application Priority Data
Aug. 13, 2021 (CN) .......................... 202110929935.8

(51) Int. Cl.
*H10D 86/60* (2025.01)
*G02F 1/1362* (2006.01)
(Continued)

(52) U.S. Cl.
CPC ....... *H10D 86/60* (2025.01); *G02F 1/136213* (2013.01); *H10D 86/40* (2025.01);
(Continued)

(58) Field of Classification Search
CPC ............... H01L 27/124; H01L 27/1214; G02F 1/134309; G02F 1/1362; G02F 1/136213;
(Continued)

(56) References Cited

U.S. PATENT DOCUMENTS

| 2016/0247467 A1* | 8/2016 | Wang .................... H04N 13/341 |
| 2018/0149930 A1* | 5/2018 | Chen ...................... G02F 1/1368 |
| 2019/0066614 A1* | 2/2019 | Tang .................... G02F 1/13452 |

FOREIGN PATENT DOCUMENTS

| CN | 105137675 A | 12/2015 |
| CN | 110109309 A | 8/2019 |

(Continued)

OTHER PUBLICATIONS

International Search Report in International application No. PCT/CN2021/113503, mailed on Mar. 29, 2022.
(Continued)

*Primary Examiner* — Adam R. Giesy
(74) *Attorney, Agent, or Firm* — PV IP PC; Christopher S. Ruprecht; Wei Te Chung

(57) ABSTRACT

Disclosed are an array substrate and a display panel. In the same frame, one of the first data line and the second data line accesses a positive polarity signal, and the other of the first data line and the second data line accesses a negative polarity signal; the first pixel electrode is electrically connected to the first data line, and the second pixel electrode is electrically connected to the second data line; the first shared electrode accesses a signal of the same polarity as the first data line, and the second shared electrode accesses a signal of the same polarity as the second data line.

20 Claims, 3 Drawing Sheets

(51) Int. Cl.
*H10D 86/40* (2025.01)
*H10K 59/123* (2023.01)

(52) U.S. Cl.
CPC ......... *H10D 86/441* (2025.01); *H10K 59/123* (2023.02); *G02F 1/1362* (2013.01)

(58) Field of Classification Search
CPC .... G02F 1/1368; H10K 59/123; H10D 86/60; H10D 86/40; H10D 86/441
See application file for complete search history.

(56) References Cited

FOREIGN PATENT DOCUMENTS

| | | |
|---|---|---|
| CN | 110910846 A | 3/2020 |
| CN | 210155492 U | 3/2020 |
| CN | 112180631 A | 1/2021 |
| KR | 20110089513 A | 8/2011 |

OTHER PUBLICATIONS

Written Opinion of the International Search Authority in International application No. PCT/CN2021/113503, mailed on Mar. 29, 2022.
Chinese Office Action issued in corresponding Chinese Patent Application No. 202110929935.8 dated Jun. 3, 2023, pp. 1-5.

* cited by examiner

ARRAY SUBSTRATE AND DISPLAY PANEL

RELATED APPLICATIONS

This application is a Notional Phase of PCT Patent Application No. PCT/CN2021/113503 having international filing date of Aug. 19, 2021, which claims the benefit of priority of Chinese Patent Application No. 202110929935.8 filed on Aug. 13, 2021. The contents of the above applications are all incorporated by reference as if fully set forth herein in their entirety.

FIELD OF THE INVENTION

The present application relates to a display technology field, and more particularly to an array substrate and a display panel.

BACKGROUND OF THE INVENTION

In research and practice of the prior art, the inventor of the present application found that the display panel is prone to appear flickering under the Stripper architecture. Specifically, the reason is that the brightnesses of the different columns are different because the polarities are different. There will be a problem of vertical lines with the movement of people's sight. With the lower the frequency and the lower the resolution of the panel, the difference between the polarities of the positive frame and negative frame relative to the common electrode is larger, and the flickering phenomenon will be more serious.

SUMMARY OF THE INVENTION

The embodiments of the present application provide an array substrate and a display panel, which can reduce the risk of flickering.

The embodiment of the present application provides an array substrate, comprising:
  a plurality of scan lines;
  a plurality of data lines, comprising a plurality of first data lines and a plurality of second data lines, and the plurality of data lines and the plurality of scan lines intersect to form a plurality of pixel regions; in a same frame, one of the first data line and the second data line is employed to access a positive polarity signal, and an other of the first data line and the second data line is employed to access a negative polarity signal;
  a plurality of pixel electrodes, arranged in the pixel regions, and the plurality of pixel electrodes comprises a plurality of first pixel electrodes and a plurality of second pixel electrodes, and the first pixel electrode is electrically connected to the first data line, and the second pixel electrode is electrically connected to the second data line; the first pixel electrode comprises a first sub-pixel electrode, and the second pixel electrode comprises a second sub-pixel electrode;
  a first shared electrode, employed to access a signal of a same polarity as the first data line, and the first sub-pixel electrode is connected to the first shared electrode through a first shared thin film transistor; and
  a second shared electrode, employed to access a signal of a same polarity as the second data line, and the second sub-pixel electrode is connected to the second shared electrode through a second shared thin film transistor.

Optionally, in some embodiments of the present application, the array substrate further comprises a first thin film transistor and a first storage capacitor;
  a gate of the first thin film transistor is connected to the scan line, and a source of the first thin film transistor is connected to the first data line, and a drain of the first thin film transistor is respectively connected to the first storage capacitor, the first sub-pixel electrode and a source of the first shared thin film transistor;
  a gate of the first shared thin film transistor is connected to the scan line, and a drain of the first shared thin film transistor is connected to the first shared electrode.

Optionally, in some embodiments of the present application, the first pixel electrode further comprises a first main pixel electrode; the array substrate further comprises a second thin film transistor and a second storage capacitor;
  a gate of the second thin film transistor is connected to the scan line, and a source of the second thin film transistor is connected to the first data line, and a drain of the second thin film transistor is respectively connected to the second storage capacitor and the first main pixel electrode.

Optionally, in some embodiments of the present application, the array substrate further comprises a third thin film transistor and a third storage capacitor; a gate of the third thin film transistor is connected to the scan line, and a source of the third thin film transistor is connected to the second data line, and a drain of the third thin film transistor is respectively connected to the third storage capacitor, the second sub-pixel electrode and a source of the second shared thin film transistor;
  a gate of the second shared thin film transistor is connected to the scan line, and a drain of the second shared thin film transistor is connected to the second shared electrode.

Optionally, in some embodiments of the present application, the second pixel electrode further comprises a second main pixel electrode; the array substrate further comprises a fourth thin film transistor and a fourth storage capacitor;
  a gate of the fourth thin film transistor is connected to the scan line, and a source of the fourth thin film transistor is connected to the second data line, and a drain of the fourth thin film transistor is respectively connected to the fourth storage capacitor and the second main pixel electrode.

Optionally, in some embodiments of the present application, the array substrate further comprises a first common electrode and a second common electrode provided in a same layer as the scan line, and a portion of the first common electrode overlaps the first sub-pixel electrode to form the first storage capacitor; a portion of the first common electrode overlaps the first main pixel electrode to form the second storage capacitor;
  a portion of the second common electrode overlaps the second sub-pixel electrode to form the third storage capacitor; a portion of the second common electrode overlaps the second main pixel electrode to form the fourth storage capacitor.

Optionally, in some embodiments of the present application, the first common electrode and the second common electrode are connected to a same scan line.

Optionally, in some embodiments of the present application, a portion of the first shared electrode overlaps the first pixel electrode.

Optionally, in some embodiments of the present application, the first data lines and the second data lines are alternately aligned along a first direction; the first shared electrode and the second shared electrode are alternately aligned along the first direction;

the plurality of first pixel electrodes are aligned in a first row along a second direction, and the plurality of second pixel electrodes are aligned in a second row along the second direction; the first row and the second row are alternately aligned along the first direction, and the first direction intersects the second direction;

the first sub-pixel electrodes of the first row are electrically connected to the first common electrode, and the second sub-pixel electrodes of the second row are electrically connected to the second common electrode.

Correspondingly, the embodiment of the present application further provides a display panel, comprising a color filter substrate and the array substrate according to any one of the above embodiments, and the color filter substrate and the array substrate are arranged opposite to each other;

the array substrate comprises:

a plurality of scan lines;

a plurality of data lines, comprising a plurality of first data lines and a plurality of second data lines, and the plurality of data lines and the plurality of scan lines intersect to form a plurality of pixel regions; in a same frame, one of the first data line and the second data line is employed to access a positive polarity signal, and an other of the first data line and the second data line is employed to access a negative polarity signal;

a plurality of pixel electrodes, arranged in the pixel regions, and the plurality of pixel electrodes comprises a plurality of first pixel electrodes and a plurality of second pixel electrodes, and the first pixel electrode is electrically connected to the first data line, and the second pixel electrode is electrically connected to the second data line; the first pixel electrode comprises a first sub-pixel electrode, and the second pixel electrode comprises a second sub-pixel electrode;

a first shared electrode, employed to access a signal of a same polarity as the first data line, and the first sub-pixel electrode is connected to the first shared electrode through a first shared thin film transistor; and a second shared electrode, employed to access a signal of a same polarity as the second data line, and the second sub-pixel electrode is connected to the second shared electrode through a second shared thin film transistor.

Optionally, in some embodiments of the present application, the array substrate further comprises a first thin film transistor and a first storage capacitor;

a gate of the first thin film transistor is connected to the scan line, and a source of the first thin film transistor is connected to the first data line, and a drain of the first thin film transistor is respectively connected to the first storage capacitor, the first sub-pixel electrode and a source of the first shared thin film transistor;

a gate of the first shared thin film transistor is connected to the scan line, and a drain of the first shared thin film transistor is connected to the first shared electrode.

Optionally, in some embodiments of the present application, the first pixel electrode further comprises a first main pixel electrode; the array substrate further comprises a second thin film transistor and a second storage capacitor;

a gate of the second thin film transistor is connected to the scan line, and a source of the second thin film transistor is connected to the first data line, and a drain of the second thin film transistor is respectively connected to the second storage capacitor and the first main pixel electrode.

Optionally, in some embodiments of the present application, the array substrate further comprises a third thin film transistor and a third storage capacitor;

a gate of the third thin film transistor is connected to the scan line, and a source of the third thin film transistor is connected to the second data line, and a drain of the third thin film transistor is respectively connected to the third storage capacitor, the second sub-pixel electrode and a source of the second shared thin film transistor;

a gate of the second shared thin film transistor is connected to the scan line, and a drain of the second shared thin film transistor is connected to the second shared electrode.

Optionally, in some embodiments of the present application, the second pixel electrode further comprises a second main pixel electrode; the array substrate further comprises a fourth thin film transistor and a fourth storage capacitor;

a gate of the fourth thin film transistor is connected to the scan line, and a source of the fourth thin film transistor is connected to the second data line, and a drain of the fourth thin film transistor is respectively connected to the fourth storage capacitor and the second main pixel electrode.

Optionally, in some embodiments of the present application, the array substrate further comprises a first common electrode and a second common electrode provided in a same layer as the scan line, and a portion of the first common electrode overlaps the first sub-pixel electrode to form the first storage capacitor; a portion of the first common electrode overlaps the first main pixel electrode to form the second storage capacitor;

a portion of the second common electrode overlaps the second sub-pixel electrode to form the third storage capacitor; a portion of the second common electrode overlaps the second main pixel electrode to form the fourth storage capacitor.

Optionally, in some embodiments of the present application, the first common electrode and the second common electrode are connected to a same scan line.

Optionally, in some embodiments of the present application, a portion of the first shared electrode overlaps the first pixel electrode.

Optionally, in some embodiments of the present application, the first shared electrode is disposed at an outer side of the first thin film transistor, the second thin film transistor and the first shared thin film transistor.

Optionally, in some embodiments of the present application, the first data lines and the second data lines are alternately aligned along a first direction; the first shared electrode and the second shared electrode are alternately aligned along the first direction;

the plurality of first pixel electrodes are aligned in a first row along a second direction, and the plurality of second pixel electrodes are aligned in a second row along the second direction; the first row and the second row are alternately aligned along the first direction, and the first direction intersects the second direction;

the first sub-pixel electrodes of the first row are electrically connected to the first common electrode, and the second sub-pixel electrodes of the second row are electrically connected to the second common electrode.

Optionally, in some embodiments of the present application, the display panel further comprises a first liquid crystal capacitor, a second liquid crystal capacitor, a third liquid crystal capacitor and a fourth liquid crystal capacitor, and the drain of the first thin film transistor is connected to the first liquid crystal capacitor, and the drain of the second thin film transistor is connected to the second liquid crystal capacitor, and the drain of the third thin film transistor is connected to the third liquid crystal capacitor, and the drain of the fourth thin film transistor is connected to the fourth liquid crystal capacitor.

Correspondingly, the embodiment of the present application further provides a display panel, comprising a color filter substrate and the array substrate according to any one of the above embodiments, and the color filter substrate and the array substrate are arranged opposite to each other;

the display panel further comprises a first liquid crystal capacitor, a second liquid crystal capacitor, a third liquid crystal capacitor and a fourth liquid crystal capacitor, and the drain of the first thin film transistor is connected to the first liquid crystal capacitor, and the drain of the second thin film transistor is connected to the second liquid crystal capacitor, and the drain of the third thin film transistor is connected to the third liquid crystal capacitor, and the drain of the fourth thin film transistor is connected to the fourth liquid crystal capacitor.

As regarding the array substrate and the display panel of the embodiment of the present application, in the array substrate and in a same frame, one of the first data line and the second data line is employed to access a positive polarity signal, and the other of the first data line and the second data line is employed to access a negative polarity signal; the first pixel electrode is electrically connected to the first data line, and the second pixel electrode is electrically connected to the second data line; the first pixel electrode comprises a first sub-pixel electrode, and the second pixel electrode comprises a second sub-pixel electrode; the first shared electrode is employed to access a signal of a same polarity as the first data line, and the first sub-pixel electrode is connected to the first shared electrode through a first shared thin film transistor; the second shared electrode is employed to access a signal of a same polarity as the second data line, and the second sub-pixel electrode is connected to the second shared electrode through a second shared thin film transistor.

In the array substrate and the display panel of the embodiment of the present application, the first sub-pixel electrode is connected to the first shared electrode through the first shared thin film transistor, and the second sub-pixel electrode is connected to the second shared electrode through the second shared thin film transistor to improve a voltage difference between the first sub-pixel electrode and the second sub-pixel electrode, thus the brightness difference between the pixels corresponding to the first pixel electrode and the pixels corresponding to the second pixel electrode in the display panel is improved, and the risk of flickering is reduced.

BRIEF DESCRIPTION OF THE DRAWINGS

In order to more clearly illustrate the embodiments of the present application, the following figures will be described in the embodiments are briefly introduced. It is obvious that the drawings are only some embodiments of the present application, those of ordinary skill in this field can obtain other figures according to these figures without paying the premise.

DETAILED DESCRIPTION OF PREFERRED EMBODIMENTS

Figure 1:
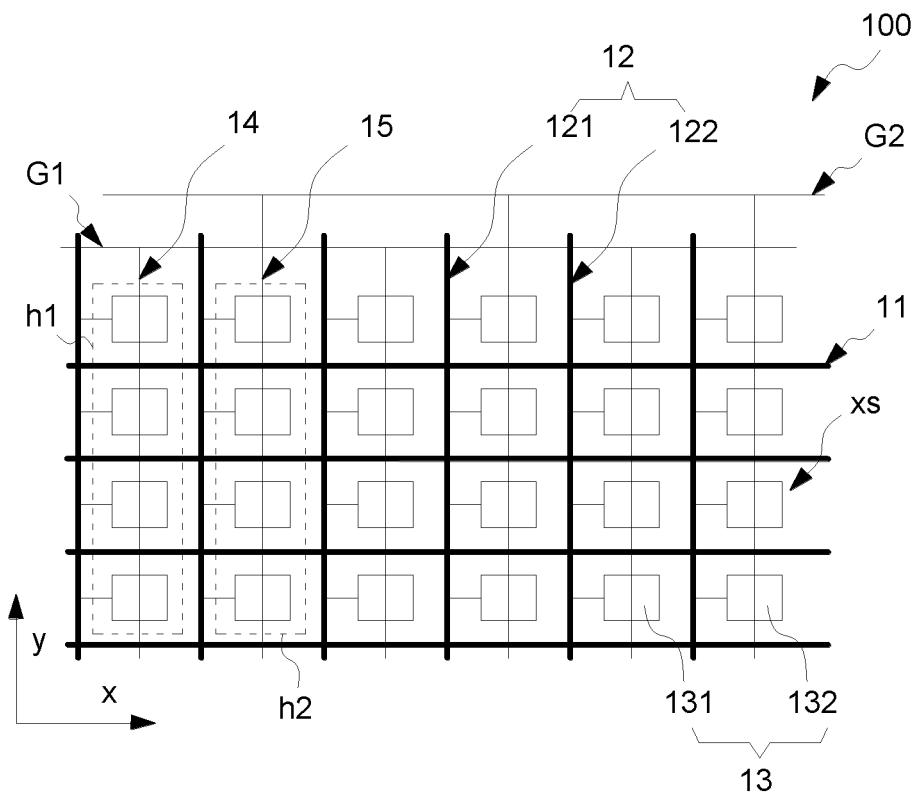
FIG. 1 is a schematic structural diagram of an array substrate provided by an embodiment of the present application.

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of skilled in the premise of no creative efforts obtained, should be considered within the scope of protection of the present application. Besides, it should be understood that the specific embodiments described herein are merely for illustrating and explaining the present application and are not intended to limit the present application. In this application, if no explanation is made to the contrary, the orientation words used such as "upper" and "lower" usually refer to the upper and lower of the device in actual use or working state, which specifically are the directions of the drawing in the figures; and "inner" and "outer" refer to the outline of the device.

The embodiment of the present application provides an array substrate and a display panel. The detail descriptions are introduced below. It should be noted that the order of description in the following embodiments is not meant to limit the preferred order of the embodiments.

The source and drain of the thin film transistor are interchangeable. In the embodiment of the present application, in order to distinguish the two electrodes of the thin film transistor except the gate, one of the electrodes is called the source and the other is called the drain. According to the formation in the figures, it is stipulated that the middle terminal of the switching thin film transistor is the gate, the signal input end is the source, and the signal output end is the drain.

Figure 2:
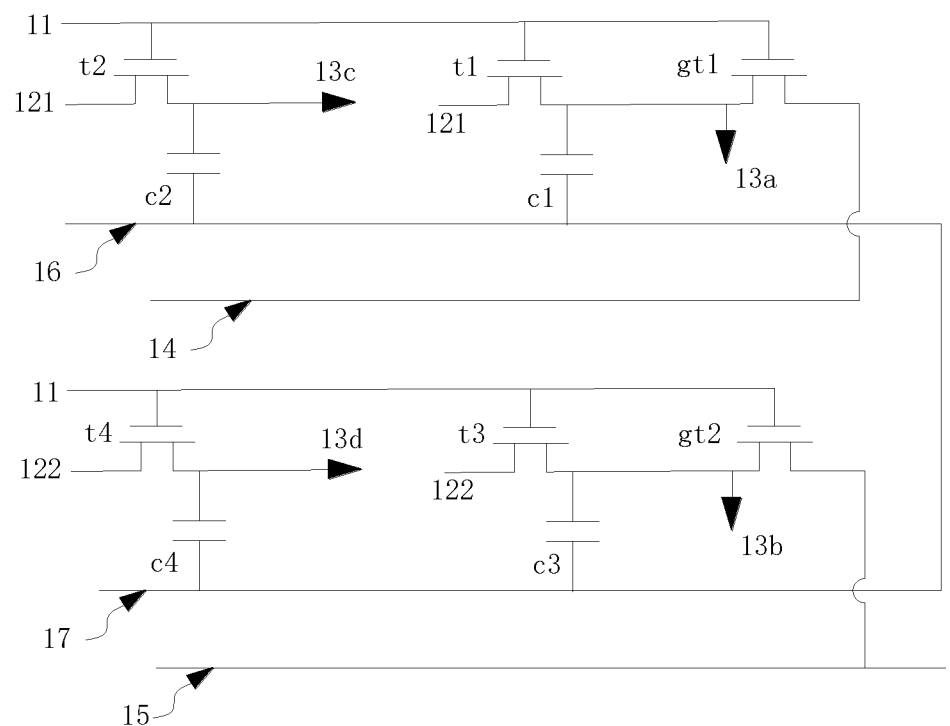
FIG. 2 is a partial equivalent circuit diagram of an array substrate provided by an embodiment of the present application.
Figure 3:
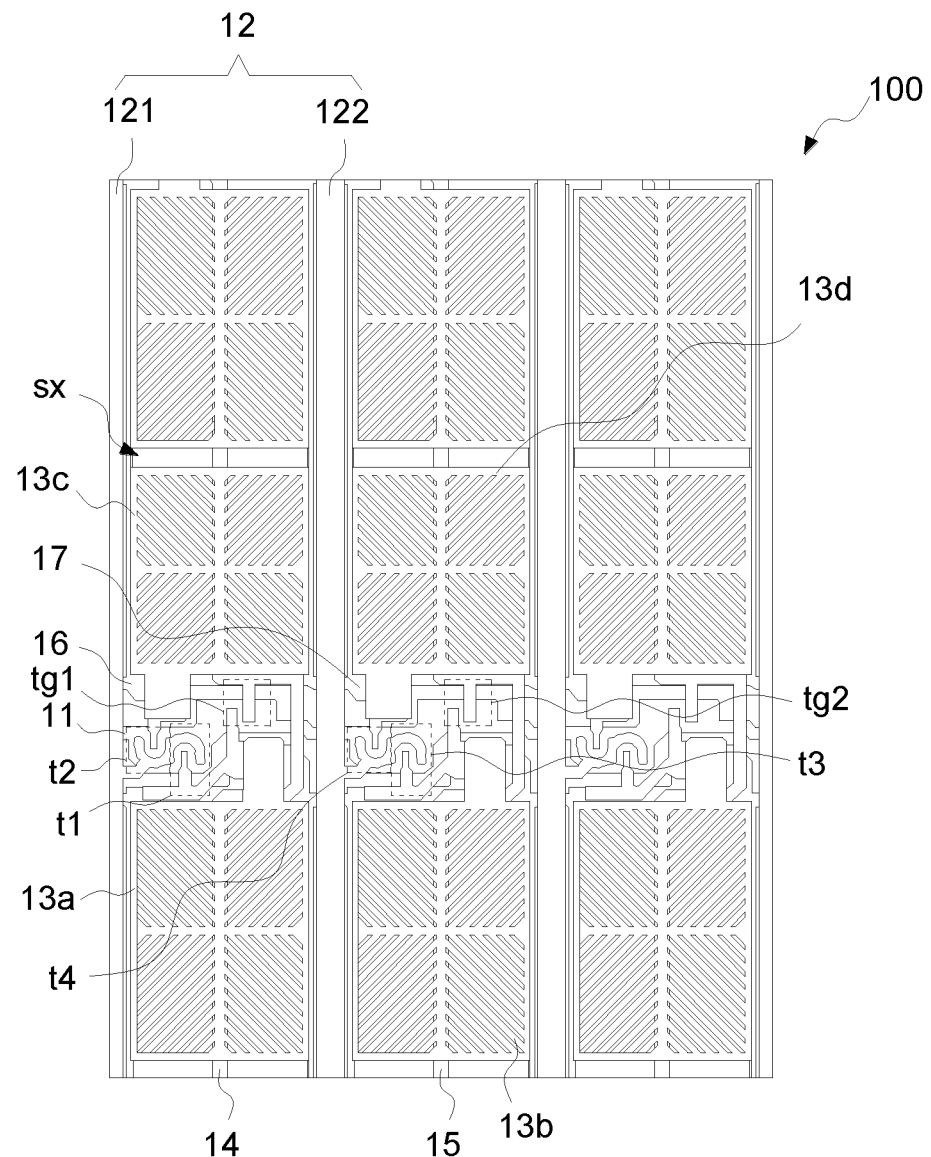
FIG. 3 is a partial structure diagram of an array substrate provided by an embodiment of the present invention.

Please refer to FIG. 1 to FIG. 3. The embodiment of the present application provides an array substrate 100, comprising a plurality of scan lines 11, a plurality of data lines 12, a plurality of pixel electrodes 13, a first shared electrode 14 and a second shared electrode 15.

The plurality of data lines 12 and the plurality of scan lines 11 intersect to form a plurality of pixel regions xs. The plurality of data lines 12 comprises a plurality of first data lines 121 and a plurality of second data lines 122. In a same frame, one of the first data line 121 and the second data line 122 is employed to access a positive polarity signal, and the other of the first data line 121 and the second data line 122 is employed to access a negative polarity signal.

The plurality of pixel electrodes 13 is arranged in the pixel regions xs. The plurality of pixel electrodes 13 comprises a plurality of first pixel electrodes 131 and a plurality of second pixel electrodes 132. The first pixel electrode 131 is electrically connected to the first data line 121. The second pixel electrode 132 is electrically connected to the second data line 122. The first pixel electrode 131 comprises a first sub-pixel electrode 13a. The second pixel electrode 132 comprises a second sub-pixel electrode 13b.

The first shared electrode 14 is employed to access a signal of a same polarity as the first data line 121. The first sub-pixel electrode 13a is connected to the first shared electrode 14 through a first shared thin film transistor gt1.

The second shared electrode 15 is employed to access a signal of a same polarity as the second data line 122. The second sub-pixel electrode 13b is connected to the second shared electrode 15 through a second shared thin film transistor gt2.

In the array substrate 100 of the embodiment of the present application, the first sub-pixel electrode 13a is connected to the first shared electrode 14 through the first shared thin film transistor gt1, and the second sub-pixel electrode 13b is connected to the second shared electrode 15 through the second shared thin film transistor gt2 to improve a voltage difference between the first sub-pixel electrode 13a and the second sub-pixel electrode 13b, thus the brightness difference between the pixels corresponding to the first pixel electrode 131 and the pixels corresponding to the second pixel electrode 132 in the display panel is improved, and the risk of flickering is reduced.

Optionally, the array substrate 100 further comprises a first thin film transistor t1 and a first storage capacitor c1.

A gate of the first thin film transistor t1 is connected to the scan line 11, and a source of the first thin film transistor t1 is connected to the first data line 121, and a drain of the first thin film transistor t1 is respectively connected to the first storage capacitor c1, the first sub-pixel electrode 13a and a source of the first shared thin film transistor gt1.

A gate of the first shared thin film transistor gt1 is connected to the scan line 11, and a drain of the first shared thin film transistor gt1 is connected to the first shared electrode 14.

Optionally, the first pixel electrode 131 further comprises a first main pixel electrode 13c. The array substrate 100 further comprises a second thin film transistor t2 and a second storage capacitor c2.

A gate of the second thin film transistor t2 is connected to the scan line 11, and a source of the second thin film transistor t2 is connected to the first data line 121, and a drain of the second thin film transistor t2 is respectively connected to the second storage capacitor c2 and the first main pixel electrode 13c.

Optionally, the array substrate 100 further comprises a third thin film transistor t3 and a third storage capacitor c3.

A gate of the third thin film transistor t3 is connected to the scan line 11, and a source of the third thin film transistor t3 is connected to the second data line 122, and a drain of the third thin film transistor t3 is respectively connected to the third storage capacitor c3, the second sub-pixel electrode 13b and a source of the second shared thin film transistor gt2.

A gate of the second shared thin film transistor gt2 is connected to the scan line 11, and a drain of the second shared thin film transistor gt2 is connected to the second shared electrode 15.

Optionally, the second pixel electrode 132 further comprises a second main pixel electrode 13d. The array substrate further 100 comprises a fourth thin film transistor t4 and a fourth storage capacitor c4.

A gate of the fourth thin film transistor t4 is connected to the scan line 11, and a source of the fourth thin film transistor t4 is connected to the second data line 122, and a drain of the fourth thin film transistor t4 is respectively connected to the fourth storage capacitor c4 and the second main pixel electrode 13d.

Optionally, please refer to FIG. 1, the first data lines 121 and the second data lines 122 are alternately aligned along a first direction x. The first shared electrode 14 and the second shared electrode 15 are alternately aligned along the first direction x.

The plurality of first pixel electrodes 131 are aligned in a first row h1 along a second direction y. The plurality of second pixel electrodes 132 are aligned in a second row h2 along the second direction y. The first row h1 and the second row h2 are alternately aligned along the first direction x. The first direction x intersects the second direction y.

Optionally, the first direction x is perpendicular to the second direction y. In some embodiments, the first direction x may not be perpendicular to the second direction y.

The first sub-pixel electrodes 13a of the first row h1 are electrically connected to the first common electrode 14. The second sub-pixel electrodes 13b of the second row h2 are electrically connected to the second common electrode 15.

Since the first sub-pixel electrodes 13a of the first pixel electrodes 131 in the entire row are connected to the first shared electrode 14, and the second sub-pixel electrodes 13b of the second pixel electrodes 132 in the entire row are connected to the second shared electrode 15 to improve the voltage difference between the first sub-pixel electrode 13a of the first row h1 and the second sub-pixel electrode 13b of the second row h2, which are adjacent. Thus, in the display panel and in the same frame, the brightness difference between the pixels corresponding to the first pixel electrode 131 and the pixels corresponding to the second pixel electrode 132 in the display panel is improved, and the risk of flickering is reduced.

Optionally, the array substrate 100 further comprises a first common line G1 and a second common line G2. The plurality of first shared electrodes 14 are connected to the first common line G1, and the plurality of second shared electrodes 15 are connected to the second common line G2.

Optionally, please refer to FIG. 3 the array substrate 100 further comprises a first common electrode 16 and a second common electrode 17 provided in the same layer as the scan line 11. A portion of the first common electrode 16 overlaps the first sub-pixel electrode 13a to form the first storage capacitor c1. A portion of the first common electrode 16 overlaps the first main pixel electrode 13c to form the second storage capacitor c2.

A portion of the second common electrode 17 overlaps the second sub-pixel electrode 13b to form the third storage capacitor c3. A portion of the second common electrode 17 overlaps the second main pixel electrode 13d to form the fourth storage capacitor c4.

Optionally, the first common electrode 16 and the second common electrode 17 are connected to the same scan line 11. The first common electrode 16 and the second common electrode 17 are alternately arranged along the first direction x.

Optionally, the data line 12, the first shared electrode 14 and the second shared electrode 15 are arranged in the same layer. The scan lines 11 and the data lines 12 are arranged in different layers.

Optionally, a portion of the first shared electrode 14 overlaps the first pixel electrode 131. The first shared electrode 14 is disposed at an outer side of the first thin film transistor t1, the second thin film transistor t2 and the first shared thin film transistor gt1.

Optionally, a portion of the second shared electrode 15 overlaps the second sub-pixel electrode 132. The second shared electrode 15 is disposed at an outer side of the third thin film transistor t3, the fourth thin film transistor t4 and the second shared thin film transistor gt2.

Optionally, the array substrate 100 of this embodiment shows that the main pixel electrode and the sub-pixel electrode are located on different sides of the scan line 11. In some embodiments, the main pixel electrode and the sub-pixel electrode may also be located on the same side of the scan line 11.

Figure 4:
FIG. 4 is a schematic structural diagram of a display panel provided by an embodiment of the present application.

Please refer to FIG. 4. Correspondingly, the embodiment of the present application further provides a display panel 1000, comprising a color filter substrate cf and the array substrate ar, and the color filter substrate cf and the array substrate ar are arranged opposite to each other.

The structure of the array substrate ar is similar or the same as the structure of the array substrate 100 of the foregoing embodiment; Therefore, for the structure of the array substrate ar of the display panel 1000 of this embodiment, reference may be made to the content described in the array substrate 100 of the foregoing embodiment.

Figure 5:
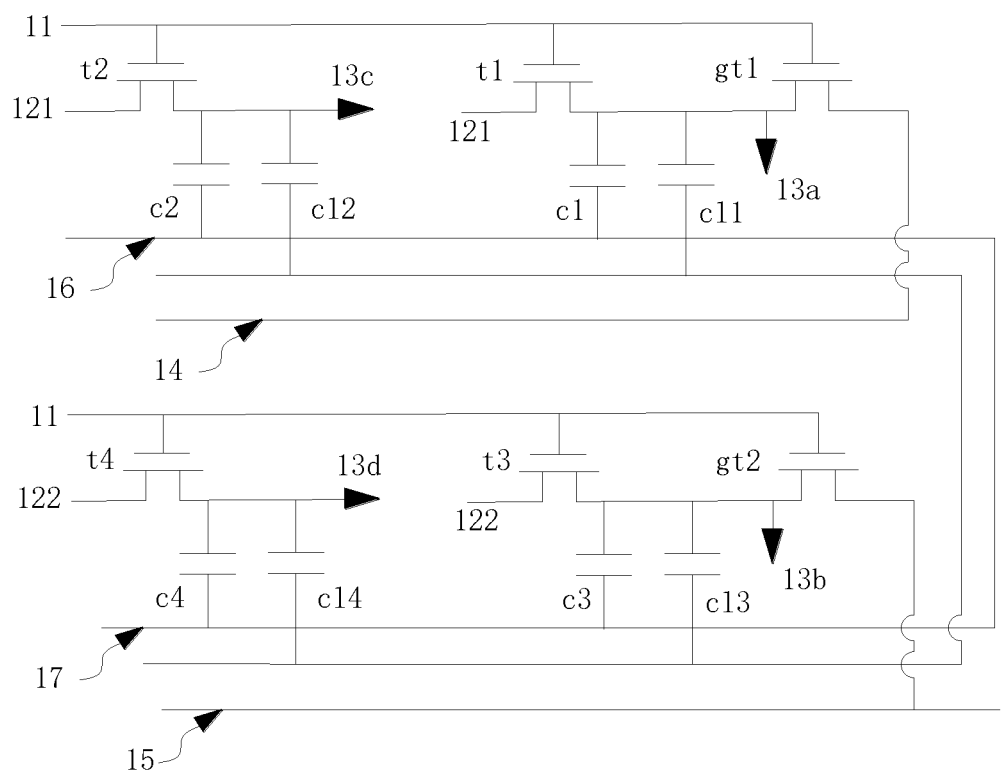
FIG. 5 is a partial equivalent circuit diagram of a display panel provided by an embodiment of the present application.

Please refer to FIG. 5. The display panel 1000 further comprises a first liquid crystal capacitor cl1, a second liquid crystal capacitor cl2, a third liquid crystal capacitor cl3 and a fourth liquid crystal capacitor cl4.

The drain of the first thin film transistor t1 is connected to the first liquid crystal capacitor cl1. The drain of the second thin film transistor t2 is connected to the second liquid crystal capacitor cl2. The drain of the third thin film transistor t3 is connected to the third liquid crystal capacitor cl3. The drain of the fourth thin film transistor t4 is connected to the fourth liquid crystal capacitor cl4.

The common electrode of the color filter substrate cf and the pixel electrode of the array substrate 100 form a liquid crystal capacitor.

In the display panel 1000 of the embodiment of the present application, the first sub-pixel electrode 13a is connected to the first shared electrode 14 through the first shared thin film transistor gt1, and the second sub-pixel electrode 13b is connected to the second shared electrode 15 through the second shared thin film transistor gt2 to improve a voltage difference between the first sub-pixel electrode 13a and the second sub-pixel electrode 13b, thus in the same frame, the brightness difference between the pixels corresponding to the first pixel electrode 131 and the pixels corresponding to the second pixel electrode 132 in the display panel is improved, and the risk of flickering is reduced.

The array substrate and the display panel provided by the embodiments of the present application are described in detail as aforementioned, and the principles and implementations of the present application have been described with reference to specific illustrations. The description of the foregoing embodiments is merely for helping to understand the technical solutions of the present application and the core ideas thereof; meanwhile, those skilled in the art will be able to change the specific embodiments and the scope of the application according to the idea of the present application. In conclusion, the content of the specification should not be construed as limiting the present application.

What is claimed is:

1. An array substrate, comprising:
   a plurality of scan lines;
   a plurality of data lines, comprising a plurality of first data lines and a plurality of second data lines, wherein every one of the first data lines is arranged alternately with every one of the second data lines along a first direction, and the plurality of data lines and the plurality of scan lines intersect to form a plurality of pixel regions; in a same frame, one of the first data lines and the second data lines is configured to be connected to a positive polarity signal, and another one of the first data lines and the second data lines is configured to be connected to a negative polarity signal;
   a plurality of pixel electrodes, arranged in the pixel regions, wherein the plurality of pixel electrodes comprises a plurality of first pixel electrodes and a plurality of second pixel electrodes, the first pixel electrodes are electrically connected to the first data lines and are not electrically connected to the second data lines, the second pixel electrodes are electrically connected to the second data lines and are not electrically connected to the first data lines, each of the first pixel electrodes comprises a first sub-pixel electrode, and each of the second pixel electrodes comprises a second sub-pixel electrode;
   a first shared electrode, configured to be connected to a signal of a same polarity as the first data lines, wherein the first sub-pixel electrode is connected to the first shared electrode through a first shared thin film transistor; and
   a second shared electrode, configured to be connected to a signal of a same polarity as the second data lines, wherein the second sub-pixel electrode is connected to the second shared electrode through a second shared thin film transistor;
   wherein a gate of the first shared thin film transistor is directly connected to a corresponding one of the scan lines, a source of the first shared thin film transistor is directly connected to the first sub-pixel electrode, and a drain of the first shared thin film transistor is directly connected to the first shared electrode.

2. The array substrate according to claim 1, further comprising a first thin film transistor and a first storage capacitor;
   wherein a gate of the first thin film transistor is connected to the corresponding one of the scan lines, a source of the first thin film transistor is connected to a corresponding one of the first data lines, and a drain of the first thin film transistor is respectively connected to the first storage capacitor, the first sub-pixel electrode and the source of the first shared thin film transistor.

3. The array substrate according to claim 2, wherein each of the first pixel electrodes further comprises a first main pixel electrode; and the array substrate further comprises a second thin film transistor and a second storage capacitor; and
   a gate of the second thin film transistor is connected to the corresponding one of the scan lines, and a source of the second thin film transistor is connected to the corresponding one of the first data lines, and a drain of the second thin film transistor is respectively connected to the second storage capacitor and the first main pixel electrode.

4. The array substrate according to claim 3, further comprising a third thin film transistor and a third storage capacitor;
   wherein a gate of the third thin film transistor is connected to another corresponding one of the scan lines, a source of the third thin film transistor is connected to the second data lines, and a drain of the third thin film transistor is respectively connected to the third storage capacitor, the second sub-pixel electrode and a source of the second shared thin film transistor; and
   a gate of the second shared thin film transistor is connected to the another corresponding one of the scan lines, and a drain of the second shared thin film transistor is connected to the second shared electrode.

5. The array substrate according to claim 4, wherein each of the second pixel electrodes further comprises a second main pixel electrode; the array substrate further comprises a fourth thin film transistor and a fourth storage capacitor; and a gate of the fourth thin film transistor is connected to the another corresponding one of the scan lines, a source of the fourth thin film transistor is connected to the another corresponding one of the second data lines, and a drain of the fourth thin film transistor is respectively connected to the fourth storage capacitor and the second main pixel electrode.

6. The array substrate according to claim 5, further comprising a first common electrode and a second common electrode provided in a same layer as the scan lines, wherein a portion of the first common electrode overlaps the first sub-pixel electrode to form the first storage capacitor; a portion of the first common electrode overlaps the first main pixel electrode to form the second storage capacitor;

a portion of the second common electrode overlaps the second sub-pixel electrode to form the third storage capacitor; and a portion of the second common electrode overlaps the second main pixel electrode to form the fourth storage capacitor.

7. The array substrate according to claim 6, wherein the first common electrode and the second common electrode are connected to a same one of the scan lines.

8. The array substrate according to claim 6, wherein a portion of the first shared electrode overlaps the first pixel electrodes.

9. The array substrate according to claim 1, wherein the first shared electrode and the second shared electrode are alternately aligned along the first direction;

the plurality of first pixel electrodes are aligned in a first row along a second direction, and the plurality of second pixel electrodes are aligned in a second row along the second direction; the first row and the second row are alternately aligned along the first direction, and the first direction intersects the second direction; and a plurality of first sub-pixel electrodes of the first row are electrically connected to the first shared electrode, and a plurality of second sub-pixel electrodes of the second row are electrically connected to the second shared electrode.

10. A display panel, comprising a color filter substrate and an array substrate, wherein the color filter substrate and the array substrate are arranged opposite to each other; and the array substrate comprises:
a plurality of scan lines;
a plurality of data lines, comprising a plurality of first data lines and a plurality of second data lines, wherein every one of the first data lines is arranged alternately with every one of the second data lines along a first direction, and the plurality of data lines and the plurality of scan lines intersect to form a plurality of pixel regions;
in a same frame, one of the first data lines and the second data lines is configured to be connected to a positive polarity signal, and another one of the first data lines and the second data lines is configured to be connected to a negative polarity signal;
a plurality of pixel electrodes, arranged in the pixel regions, wherein the plurality of pixel electrodes comprises a plurality of first pixel electrodes and a plurality of second pixel electrodes, the first pixel electrodes are electrically connected to the first data lines and are not electrically connected to the second data lines, and the second pixel electrodes are electrically connected to the second data lines and are not electrically connected to the first data lines; each of the first pixel electrodes comprises a first sub-pixel electrode, and each of the second pixel electrodes comprises a second sub-pixel electrode;

a first shared electrode, configured to be connected to a signal of a same polarity as the first data lines, wherein the first sub-pixel electrode is connected to the first shared electrode through a first shared thin film transistor; and a second shared electrode, configured to be connected to a signal of a same polarity as the second data lines, wherein the second sub-pixel electrode is connected to the second shared electrode through a second shared thin film transistor;

wherein a gate of the first shared thin film transistor is directly connected to a corresponding one of the scan lines, a source of the first shared thin film transistor is directly connected to the first sub-pixel electrode, and a drain of the first shared thin film transistor is directly connected to the first shared electrode.

11. The display panel according to claim 10, further comprising a first thin film transistor and a first storage capacitor;

wherein a gate of the first thin film transistor is connected to the corresponding one of the scan lines, and a source of the first thin film transistor is connected to a corresponding one of the first data lines, and a drain of the first thin film transistor is respectively connected to the first storage capacitor, the first sub-pixel electrode and the source of the first shared thin film transistor.

12. The display panel according to claim 11, wherein each of the first pixel electrodes comprises a first main pixel electrode; the array substrate further comprises a second thin film transistor and a second storage capacitor; and a gate of the second thin film transistor is connected to the corresponding one of the scan lines, a source of the second thin film transistor is connected to the corresponding one of the first data lines, and a drain of the second thin film transistor is respectively connected to the second storage capacitor and the first main pixel electrode.

13. The display panel according to claim 12, further comprising a third thin film transistor and a third storage capacitor;

wherein a gate of the third thin film transistor is connected to another corresponding one of the scan lines, a source of the third thin film transistor is connected to the second data lines, and a drain of the third thin film transistor is respectively connected to the third storage capacitor, the second sub-pixel electrode and a source of the second shared thin film transistor; and a gate of the second shared thin film transistor is connected to the another corresponding one of the scan lines, and a drain of the second shared thin film transistor is connected to the second shared electrode.

14. The display panel according to claim 13, wherein each of the second pixel electrodes further comprises a second main pixel electrode; the array substrate further comprises a fourth thin film transistor and a fourth storage capacitor; and a gate of the fourth thin film transistor is connected to the another corresponding one of the scan lines, a source of the fourth thin film transistor is connected to the another corresponding one of the second data lines, and a drain of the fourth thin film transistor is respectively connected to the fourth storage capacitor and the second main pixel electrode.

15. The display panel according to claim 14, further comprising a first common electrode and a second common electrode provided in a same layer as the scan lines, wherein a portion of the first common electrode overlaps the first sub-pixel electrode to form the first storage capacitor; a portion of the first common electrode overlaps the first main pixel electrode to form the second storage capacitor;
   a portion of the second common electrode overlaps the second sub-pixel electrode to form the third storage capacitor; and a portion of the second common electrode overlaps the second main pixel electrode to form the fourth storage capacitor.

16. The display panel according to claim 15, wherein the first common electrode and the second common electrode are connected to a same one of the scan lines.

17. The display panel according to claim 15, wherein a portion of the first shared electrode overlaps the first pixel electrodes.

18. The display panel according to claim 15, wherein the first shared electrode is disposed at an outer side of the first thin film transistor, the second thin film transistor and the first shared thin film transistor.

19. The display panel according to claim 14, further comprising a first liquid crystal capacitor, a second liquid crystal capacitor, a third liquid crystal capacitor and a fourth liquid crystal capacitor, wherein the drain of the first thin film transistor is connected to the first liquid crystal capacitor, and the drain of the second thin film transistor is connected to the second liquid crystal capacitor, and the drain of the third thin film transistor is connected to the third liquid crystal capacitor, and the drain of the fourth thin film transistor is connected to the fourth liquid crystal capacitor.

20. An array substrate, comprising:
   a plurality of scan lines;
   a plurality of data lines comprising a plurality of first data lines and a plurality of second data lines; wherein the plurality of data lines and the plurality of scan lines intersect to form a plurality of pixel regions; and in a same frame, one of the first data lines and the second data lines is configured to be connected to a positive polarity signal, and another one of the first data lines and the second data lines is configured to be connected to a negative polarity signal;
   a plurality of pixel electrodes arranged in the pixel regions; wherein the plurality of pixel electrodes comprises a plurality of first pixel electrodes and a plurality of second pixel electrodes, the first pixel electrodes are electrically connected to the first data lines, the second pixel electrodes are electrically connected to the second data lines, each of the first pixel electrodes comprises a first sub-pixel electrode, and each of the second pixel electrodes comprises a second sub-pixel electrode;
   a first shared electrode configured to be connected to a signal of a same polarity as the first data lines, wherein the first sub-pixel electrode is connected to the first shared electrode through a first shared thin film transistor; and
   a second shared electrode configured to be connected to a signal of a same polarity as the second data lines, wherein the second sub-pixel electrode is connected to the second shared electrode through a second shared thin film transistor;
   wherein the array substrate further comprises a first thin film transistor and a first storage capacitor;
   a gate of the first thin film transistor is connected to a corresponding one of the scan lines, a source of the first thin film transistor is connected to a corresponding one of the first data lines, and a drain of the first thin film transistor is respectively connected to the first storage capacitor, the first sub-pixel electrode and a source of the first shared thin film transistor; and
   a gate of the first shared thin film transistor is connected to the corresponding one of the scan lines, and a drain of the first shared thin film transistor is connected to the first shared electrode.

* * * * *